United States Patent
Dray et al.

(10) Patent No.: US 6,639,427 B2
(45) Date of Patent: Oct. 28, 2003

(54) HIGH-VOLTAGE SWITCHING DEVICE AND APPLICATION TO A NON-VOLATILE MEMORY

(75) Inventors: Cyrille Dray, Eybens (FR); Sigrid Thomas, Grenoble (FR)

(73) Assignee: STMicroelectronics SA, Montrouge (FR)

(*) Notice: Subject to any disclaimer, the term of this patent is extended or adjusted under 35 U.S.C. 154(b) by 9 days.

(21) Appl. No.: 09/996,071

(22) Filed: Nov. 28, 2001

(65) Prior Publication Data

US 2002/0079545 A1 Jun. 27, 2002

(30) Foreign Application Priority Data

Nov. 29, 2000 (FR) .............................. 00 15447

(51) Int. Cl.[7] .......................................... H03K 19/0185
(52) U.S. Cl. .............................. 326/83; 326/17; 326/31; 326/87; 326/81; 327/333; 327/65; 365/189.11
(58) Field of Search .............................. 326/17, 31, 68, 326/81, 83, 87; 327/52, 54, 65, 333, 530; 365/189.09, 189.11, 230.01

(56) References Cited

U.S. PATENT DOCUMENTS 6,064,227 A    5/2000  Saito ........................... 326/68

6,114,875 A  * 9/2000  Gerber et al. .................. 326/80

FOREIGN PATENT DOCUMENTS

| EP | 0 556 605 | 8/1993 | ....... H03K/19/0185 |
| EP | 0 643 487 | 3/1995 | ....... H03K/19/0185 |
| EP | 0 840 453 | 5/1998 | ......... H03K/19/003 |

OTHER PUBLICATIONS

Patent abstracts of Japan, vol. 1997, No. 5 dated Jun. 30, 1995 entitled "Voltage Level Shifting Circuit"; publication number 09018328.

* cited by examiner

*Primary Examiner*—Daniel Chang
(74) *Attorney, Agent, or Firm*—Lisa K. Jorgenson; Allen, Dyer, Doppelt, Milbrath & Gilchrist, P.A.

(57) ABSTRACT

A high voltage switching device includes a switching circuit for switching a high voltage to an output line and for providing a control signal. The high voltage switching device also includes a switching transistor connected to the switching circuit for switching a low voltage to the output line based upon the control signal. The output signal is controlled by a control circuit that sets up a control loop between the drop in the gate voltage level of the switching transistor and the voltage level of the output line that is controlled by the switching circuit.

38 Claims, 3 Drawing Sheets

HIGH-VOLTAGE SWITCHING DEVICE AND APPLICATION TO A NON-VOLATILE MEMORY

FIELD OF THE INVENTION

The present invention relates to a high voltage switching device. The high voltage switching device may be applied to non-volatile memories, such as a FAMOS type non-volatile memory as well as EPROM, EEPROM and Flash EPROM-type non-volatile memories.

The above mentioned memories include connection lines connected to rows of memory cells. A high voltage or a low voltage must be provided to these rows of memory cells. The present invention intends to accelerates the discharge rate of the connection lines from the high voltage to the low voltage. More particularly, the invention is concerned with output lines controlled by the switching device that are capacitive and are capable of conducting current.

BACKGROUND OF THE INVENTION

In an exemplary application to a FAMOS type non-volatile memory, connection lines will typically be connected to rows of memory cells that contact the sources of FAMOS transistors within each memory cell. In this type of application, the switching device, in addition to the usual translator type switch, must have an additional switching transistor. First, the switching transistor initially helps the switch to discharge the output line(s) from the high voltage level to a low voltage level, which is typically the logic supply voltage Vcc. Second, the switching transistor must hold the low voltage level on these lines. Thus, in the latter case, this switching transistor provides the current needed to hold the voltage level on the line.

In the exemplary application to the rows of the FAMOS memory cells, the rows must be held at the logic supply voltage level Vcc during the read operation. In an exemplary application to Flash EPROMs, these output lines will be the rows connected to the control gates of the floating gate transistors. The switching transistor then holds these lines at the logic supply voltage level during a read operation, and at a high voltage level during a programming operation. In an application of this kind, a device for drawing the voltage to zero must be provided to draw the unselected rows to zero.

Figure 1:
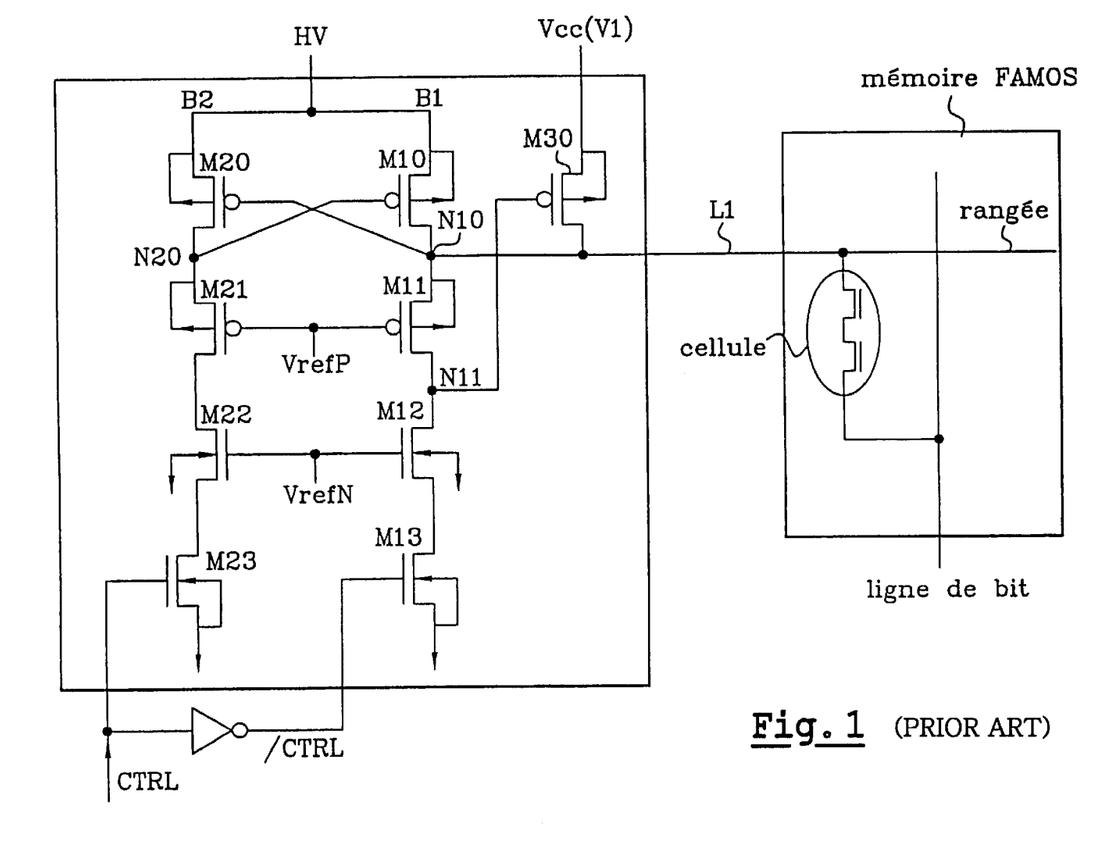
FIG. 1 is a schematic diagram of a device for switching a high voltage to a capacitive output line according to the prior art.

FIG. 1 shows a prior art MOS technology switching device applied to a row of FAMOS type memory cells. The device is made, in the example, with N-type and P-type MOS transistors. This switching device conventionally, as explained above, comprises a translator type switch and an additional switching transistor.

The switching device has two switching arms B1 and B2. The two switching arms have a similar structure. The switching arm B1 has a load transistor M10 connected to the high voltage HV, a switching transistor M13 connected to ground Gnd and receiving at its gate a logic control signal CTRL, and a cascode stage connected between these two transistors. In the example, the cascode stage has two cascode transistors M11 and M12. In practice, it has at least one of them. The connection point N10 between the load transistor M10 and the cascode transistor M11 of an arm is applied as a signal to activate the load transistor of the other arm.

Similarly, the arm B2 comprises a load transistor M20 connected to the high voltage HV, a switching transistor M23 connected to ground Gnd and receiving at its gate the reverse control signal CTRL, and a cascode stage connected between these two transistors M20 and M23. In the example, the cascode stage has two cascode transistors M21 and M22, biased by reference voltages $V_{REFP}$ and $V_{REFN}$ given by a generation circuit that is not shown. The transistors M20 and M21 are P-type MOS transistors, and the MOS transistors M22 and M23 are N-type MOS transistors. The connection point N20 between the load transistor M20 and the cascode transistor M21 of an arm is applied as a signal to activate the load transistor M10 of the other arm.

In the example, it is the node N10 of the first arm B1 that gives the output signal of the switch. This node N10 is therefore connected to an output line L1, which is a capacitive line. In a well known way, and without being necessary to provide a detailed description on the operation of the switch, the node N10 has a level corresponding to the high voltage HV when the control signal CTRL is at the logic level 1 and while the load transistor M13 is off. The node N10 has a logic supply voltage level Vcc when the control signal CTRL is at the logic level 0 and while the load transistor M13 is off.

In the example, the output line L1 controlled by the switch corresponds to a row of FAMOS cells, which contacts all the sources of the FAMOS transistor in the row of cells. FIG. 1 shows only one of these cells, which comprises a FAMOS transistor and an associated selection transistor. The cell sources are connected to a corresponding bit line through which the cell state is read while the row is taken to the logic supply voltage level Vcc. Furthermore, cell programming is obtained while the associated row is taken to the high voltage level 1.

In the read mode, if the cell is programmed, the row potential tends to drop. It is therefore necessary to plan for the switching device to maintain the row at the read potential, namely the logic supply voltage level Vcc. This function is fulfilled by the additional switching transistor M30, connected between the logic supply voltage level Vcc and the output line L1.

Furthermore, when the line L1 is at the high voltage and the switch trips into the other state, this switching transistor provides knowledge that the node N10 has gone to the logic supply voltage level Vcc. This provides the discharge current of the capacitive line L1, and brings this line from the high voltage level to the lower logic supply voltage level Vcc. In practice, this transistor is controlled by the connection node between the two cascode transistors of the arm providing the output signal of the switch. In the example, it is the node N11 of the arm B1.

If the switch comprises only one cascode transistor per arm, the connection node used is the one between the single cascode transistor and the switching transistor of the arm giving the output signal. When the node N10 is at the high voltage level, the node N11 is also at the high voltage level HV. When the node N10 is at the logic supply voltage level Vcc, the node N11 is drawn to zero.

The additional switching transistor M30 is subjected to repeated electrical stresses in the device. If it is assumed that the node N10 and therefore the output line L1 are at the high voltage level HV, the gate of the switching transistor M30 connected to the node N11 is also at the high voltage level. This turns the switching transistor M30 off. If the switch trips, the node N10 goes to Vcc. The switching transistor M30 absorbs the discharge current that takes the capacitive line L1 from the high voltage level HV to the low voltage level Vcc.

However, this discharge is slow due to the capacitance of the line L1. The node N11 of the switch swiftly goes to a zero voltage level. Thus, there is a very high potential difference between the gate and the electrode of the transistor M30 connected to the line L1 during a part of the discharge time of the line L1.

SUMMARY OF THE INVENTION

An object of the invention is to resolve the problem of electrical stresses on the switching transistor M30. The invention is based upon keeping the potential difference between the gate of the transistor M30 and the output line constant. In a high voltage level switching device with a translator type switch, a low voltage level switching transistor is provided. This transistor is activated by an output signal of the switch. This output signal is controlled by a circuit used to set up a control loop between the drop in the gate voltage level of the switching transistor, and the drop in the voltage level of the output line controlled by the switch.

The invention therefore relates to a MOS technology switching device comprising a translator type switch to switch a high voltage level to at least one capacitive type output line, and a transistor for switching a low voltage level to the output line. The switching transistor may be controlled by a signal given by the switch. The signal level may be at the high voltage level to turn the transistor off when the switch applies the high voltage level at the output line. Alternately, the signal level may be at ground level to turn the transistor on and take the output line to the low voltage level.

The switching device furthermore comprises a control circuit to control the drop in the voltage level of the control signal of the switching transistor from the high voltage level to the ground voltage level. The control circuit may be looped with the voltage drop level on the output line from the high voltage level to the low voltage level.

In one embodiment, the connection node between the load transistor and the cascode transistor of an arm is connected to the output line. In another embodiment, the switch comprises an additional load transistor connected between the high voltage and the output line, and is controlled by the same control signal as the load transistor of one of the switching arms.

In yet another embodiment, the switch furthermore comprises a transistor mounted as a resistor between the two switching arms. The connection point of the transistor in both switching arms may be the connection point between the load transistor and the cascode transistor.

BRIEF DESCRIPTION OF THE DRAWINGS

Other features and advantages of the invention shall be described in detail in the following description, given by way of an indication that in no way restricts the scope of the invention, with reference to the appended drawings of which.

DETAILED DESCRIPTION OF THE PREFERRED EMBODIMENTS

Figure 2:
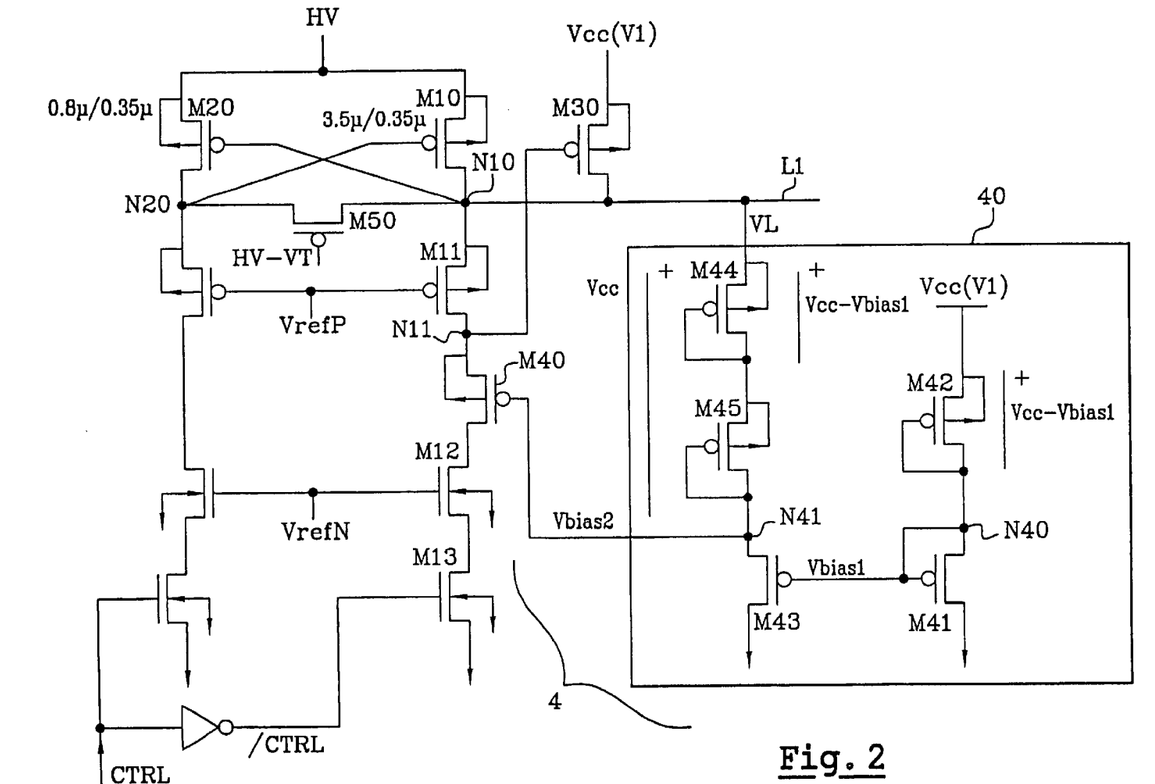
FIG. 2 is a schematic diagram of one embodiment of a switching device according to the invention.

FIG. 2 shows a MOS technology switching device according to a first embodiment of the invention. The elements common to FIGS. 1 and 2 have the same references. All the transistors are MOS transistors.

According to the invention, in addition to the elements described above, the switching device comprises a circuit 4 to control the gate voltage of the transistor M30. The control circuit 4 comprises a follower transistor M40 connected between the cascode transistors M11 and M12 of the arm B1, which provides the output signal that controls the output line L1. Had there been only one cascode transistor, M11 for example, the follower transistor M40 would be connected in series between the cascode transistor M11 and the switching transistor M13 of the arm B1.

With the switching device comprising at least one cascode transistor in each arm, the follower transistor in the arm B1 associated with the output line L1 is connected in series with the cascode transistor M11 of the arm B1. The follower transistor is between the cascode transistor M11 and the switching transistor M13 of the arm B1.

The transistor M40 is controlled by a voltage translator circuit 40 for applying a voltage Vbias2 to the gate of the transistor M40. The voltage Vbias2 may be obtained by translating the logic supply voltage level Vcc to the line L1 voltage level. The line voltage level is referenced VL and the threshold voltage of a MOS transistor is referenced VT.

The starting point is where VL=HV and the node N10 may be at the same voltage level. At this time, the gate voltage level of the transistor M40, Vbias2, equals VL−Vcc, that is HV−Vcc. Since the switching transistor is not on, the node N11 is at HV like N10. The switch trips and the signal CTRL goes from logic a 1 to a 0 and the switching transistor M13 turns on. The follower effect is operational, and the level of the voltage at the node 11 is imposed by the gate of the transistor M40, which is equal to Vbias2+VT.

Thus, while the line L1 has not had the time to discharge, the voltage level at the line L1 is still at HV. But, the level at the gate of the transistor M30 does not switch over to zero, as in the prior art. Rather it goes to HV−Vcc. The difference in potential between the gate and the output line is equal to Vcc−VT. Consequently, the transistor M30 is not subjected to stress and the line L1 is gradually discharged, mainly through the transistor M30.

As the line voltage VL diminishes, the gate voltage diminishes too. Thus, the potential difference between the gate of the transistor M30 and the line L1 to which it is connected remains constant. When the line L1 reaches the voltage level Vcc, the voltage level at the gate becomes equal to VT. The role of the transistor M30 is inverted and becomes a current generator for the line L1, to hold the voltage level of the line L1 at the logic supply voltage level.

It will be noted that the switching device according to the invention is applicable for switching a high voltage level or a low voltage level V1 to the output line L1, which cannot have the logic supply voltage level, but also to any bias voltage level defined as a function of the application. In this case, the control circuit 4, according to the invention, applies HV−V1 to the gate of the transistor M30 (when the switching transistor M13 is on) to maintain the potential difference between the gate of the transistor M30 and the output line L1 at the voltage level V1−VT.

The voltage translator circuit has two arms. The first arm has a first transistor M41 whose gate and drain are connected together at a bias node N40 and a bias voltage level Vbias1 given by a first assembly of diode-mounted transistors connected in series between the supply voltage Vcc (V1) and the bias node N40. In the example, this is illustrated by a single transistor M42. The second arm has a second transistor M43 mounted as a current mirror with respect to the first transistor. Its gate is connected to the gate of the transistor M41 to control an identical current in both arms. The transistors M41 and M43 are identical.

A second assembly of diode-mounted transistors is connected in series between the output line L1 and the second transistor M43. The connection node N41 between the second assembly and the transistor M43 gives the gate control signal of the follower transistor M40. The second series assembly comprises, in the example, a first transistor M44 identical to the transistor M42 of the other arm, and a transistor M45 whose dimensions are defined to obtain a voltage level drop between the line L1 and the node N41 to the desired value in the translation, namely Vcc (V1). This is determined by knowing, because of the current mirror structure, that the drop in the voltage level at the terminals of the transistor M44 is equal to the drop in the voltage level at the terminals of the transistor M42, namely Vcc–Vbias1.

If the first assembly linked to the first arm of the voltage translator circuit comprises more than one transistor, for example, two transistors, the second assembly has the same number of transistors in addition to at least one additional transistor to make the desired adjustment in the voltage level drop. Thus, a voltage level Vbias2 is obtained at the gate of the transistor M40. The voltage level Vbias2 equals the line L1 voltage level VL minus the logic supply voltage level Vcc (or at least V1).

In FIG. 2, the switch comprises an additional transistor M50, connected between the nodes N10 and N20. The transistor M50 is controlled at its gate by a reference voltage level given by a reference source (not shown) so that it is on. It then works like a resistor, enabling the diagonal bias of the cascode stage. At a given time and as a function of the logic control signal CTRL, the load transistor of one arm and the cascode and switching transistors of the other arm are on.

The transistor M50 lets through the current along the diagonal going in the direction from the load transistor to the switching transistor, with these two transistors being on. For the transistor M50 not to shunt excessive current, a reference voltage level on the order of the high voltage level minus a transistor threshold voltage level is applied to the transistor M50 gate. The transistor mounted as a resistor between the two arms favors the biasing of the cascode stage transistors. This improves the function of the switch.

Figure 3:
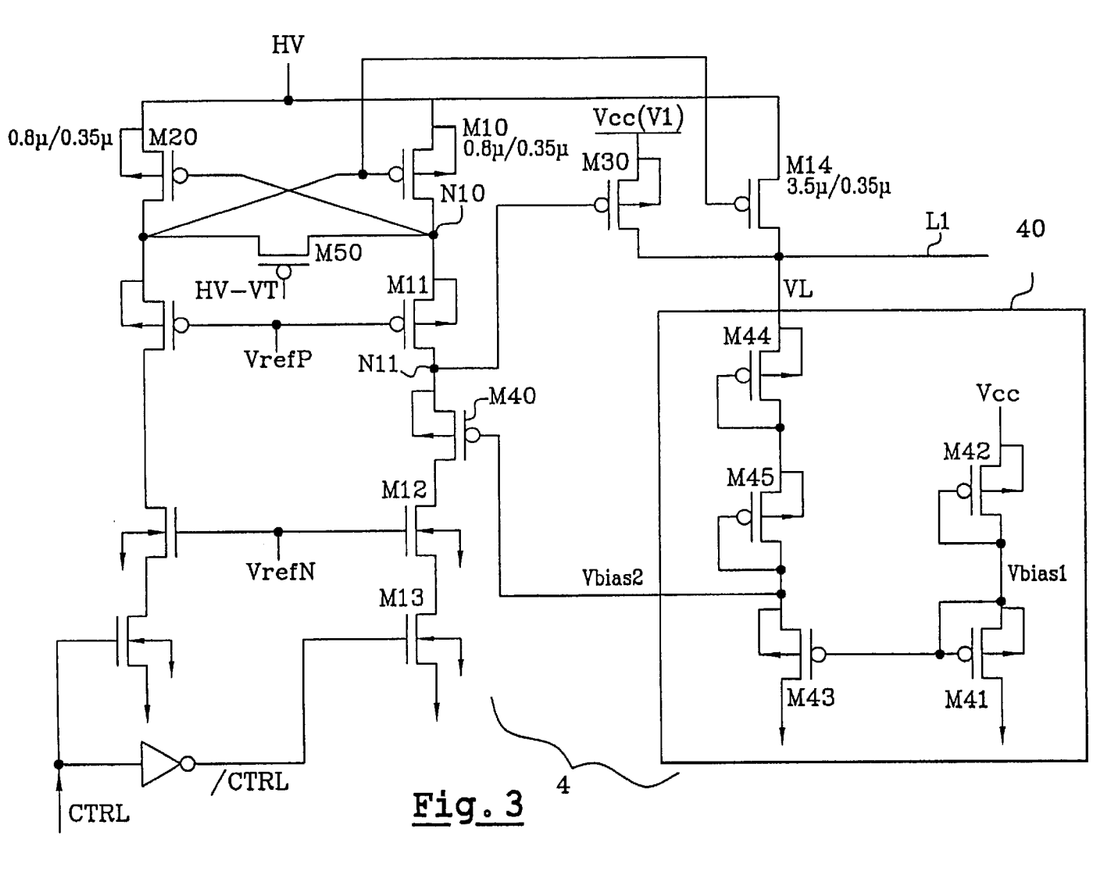
FIG. 3 is a schematic diagram of another embodiment of the switching device according to the invention.

FIG. 3 shows another embodiment of the invention. In this embodiment, the switch comprises an additional load transistor M14 controlled by the same control signal as the load transistor of the arm controlling the output line, namely through the signal at the node N11. The transistor M14 is connected between the high voltage HV and the output line L1. Thus, the output signal is given by the transistor M14 and no longer by the node N11.

This separates the pure switching function from the function of supplying a charging current at the high voltage level, namely the power function of the switch related to the capacitive nature of the output line L1. Thus, the tripping speed of the switch is improved. In this way, the load transistors M10 and M20 of the switching function are identical. The load transistor M14 of the power function is far bigger.

It is noted that, in this embodiment, the discharging of the output line L1 from the voltage level HV to the lower voltage level Vcc (V1) is entirely performed by the transistor M30. In the other embodiment, as illustrated in FIG. 2, the transistor M13 of the output arm of the switch shared this function with the transistor M30.

The high voltage level switching device, according to the invention, may be used in any application with a capacitive line capable of switching current. Apart from the application to the rows of FAMOS memory cells or flash EPROM cells, it may be applied to other types of non-volatile memory cells.

What is claimed is:

1. A high voltage switching device comprising:
   a translator type switch for switching a high voltage to at least one capacitive type output line and for providing a control signal;
   a switching transistor connected to said translator type switch for switching a low voltage to the at least one capacitive type output line based upon the control signal, the control signal having a first level to turn said switching transistor off when said translator type switch applies the high voltage to the at least one capacitive type output line, and having a second level to turn said switching transistor on so that the low voltage is applied to the at least one capacitive type output line; and
   a control circuit connected to said translator type switch and to said switching transistor for providing a control loop for controlling a drop in voltage of the control signal applied to said switching transistor based upon a drop in voltage on the at least one capacitive type output line from the high voltage to the low voltage.

2. A high voltage switching device according to claim 1, wherein said translator type switch further comprises:
   a first switching arm connected to the at least one capacitive type output line; and
   a second switching arm connected to said first switching arm; and
   each switching arm comprising a load transistor connected to the high voltage, a first transistor connected to the low voltage and comprising a control terminal for receiving a logic control signal, and at least one cascode transistor connected between said load transistor and said first transistor, and a signal on a control signal connection node between said load transistor and said at least one cascode transistor of one of said switching arms is applied as an arm control signal to said load transistor of the other switching arm;
   said first switching arm having a control signal connection node and an output line connection node between said load transistor and said at least one cascode transistor.

3. A high voltage switching device according to claim 2, wherein said translator type switch further comprises a transistor configured as a resistor connected between said first and second switching arms for favoring biasing of said at least one cascode transistor in said first switching arm, and a connection node of said transistor in each switching arm being between said load transistor and said at least one cascode transistor.

4. A high voltage switching device according to claim 2, wherein said control circuit comprises:
   a follower transistor connected in series with said at least one cascode transistor and said first transistor in said first switching arm, and a connection point between said at least one cascode transistor and said follower transistor for providing the control signal to said switching transistor; and
   a voltage translator circuit for translating a level of the voltage of the at least one capacitive type output line to the low voltage for providing a follower control signal to said follower transistor.

5. A high voltage switching device according to claim 4, wherein said voltage translator circuit comprises:
   a first arm comprising
      a first transistor comprising a control terminal and a conducting terminal connected to each other at a bias node, the bias node receiving a first bias voltage, and
      a first assembly of at least one diode configured transistor connected in series between the low voltage and the bias node for supplying the first bias voltage; and
   a second arm comprising
      a second transistor connected as a current mirror with respect to said first transistor, and
      a second assembly of diode configured transistors connected in series between the at least one capacitive type output line and said second transistor, and a connection node between said second assembly of diode configured transistors and said second transistor providing the follower control signal to said follower transistor.

6. A high voltage switching device according to claim 1, wherein said translator type switch further comprises:
   a first switching arm associated with the at least one capacitive type output line; and
   a second switching arm connected to said first switching arm;
   each switching arm comprising a load transistor connected to the high voltage, a first transistor connected to the low voltage and comprising a control terminal for receiving a logic control signal, and at least one cascode transistor connected between said load transistor and said first transistor, and a signal on a control signal connection node between said load transistor and said at least one cascode transistor of one of said switching arms is applied as an arm control signal to said load transistor of the other switching arm;
   said first switching arm further comprising an additional load transistor connected between the high voltage and the at least one capacitive type output line and being controlled by the control signal.

7. A high voltage switching device according to claim 6, wherein said translator type switch further comprises a transistor configured as a resistor connected between said first and second switching arms for favoring biasing of said at least one cascode transistor in said first switching arm, and a connection node of said transistor in each switching arm being between said load transistor and said at least one cascode transistor.

8. A high voltage switching device according to claim 6, wherein said control circuit comprises:
   a follower transistor connected in series with said at least one cascode transistor and said first transistor in said first switching arm, and a connection point between said at least one cascode transistor and said follower transistor for providing the control signal to said switching transistor; and
   a voltage translator circuit for translating a level of the voltage of the at least one capacitive type output line to the low voltage for providing a follower control signal to said follower transistor.

9. A high voltage switching device according to claim 8, wherein said voltage translator circuit comprises:
   a first arm comprising
      a first transistor comprising a control terminal and a conducting terminal connected to each other at a bias node, the bias node receiving a first bias voltage, and
      a first assembly of at least one diode configured transistor connected in series between the low voltage and the bias node for supplying the first bias voltage; and
   a second arm comprising
      a second transistor connected as a current mirror with respect to said first transistor, and
      a second assembly of diode configured transistors connected in series between the at least one capacitive type output line and said second transistor, and a connection node between said second assembly of diode configured transistors and said second transistor providing the follower control signal to said follower transistor.

10. A high voltage switching device according to claim 1, wherein the low voltage equals a logic supply voltage.

11. An integrated circuit comprising:
    at least one switching device connected to at least one output line and comprising
       a switching circuit for switching a high voltage to the at least one output line, and for providing a control signal;
       a switching transistor connected to said switching circuit for switching a low voltage to the at least one output line based upon the control signal, the control signal having a first level to turn said switching circuit off when said translator type switch applies the high voltage to the at least one output line, and a second level to turn said switching transistor on so that the low voltage is applied to the at least output line; and
       a control circuit connected to said switching circuit and to said switching transistor for providing a control loop for controlling a drop in voltage of the control signal applied to said switching transistor based upon a drop in voltage on the at least one output line from the high voltage to the low voltage; and
    a circuit connected to the at least one output line for receiving the high voltage or the low voltage.

12. An integrated circuit according to claim 11, wherein said circuit comprises a memory comprising an array of memory cells therein; and wherein the at least one output line comprises a plurality of memory cell selection lines.

13. An integrated circuit according to claim 12, wherein said memory comprises at least one of a FAMOS memory and a Flash EPROM; and wherein each memory cell selection line is connected to a row of memory cells.

14. An integrated circuit according to claim 11, wherein said switching circuit further comprises:
    a first switching arm connected to the at least one output line; and
    a second switching arm connected to said first switching arm; and
    each switching arm comprising a load transistor connected to the high voltage, a first transistor connected to the low voltage and comprising a control terminal for receiving a logic control signal, and at least one cascode transistor connected between said load transistor and said first transistor, and a signal on a control signal connection node between said load transistor and said at least one cascode transistor of one of said switching arms is applied as an arm control signal to said load transistor of the other switching arm;
    said first switching arm having a control signal connection node and an output line connection node between said load transistor and said at least one cascode transistor.

15. An integrated circuit according to claim 14, wherein said switching circuit further comprises a transistor configured as a resistor connected between said first and second switching arms for favoring biasing of said at least one cascode transistor in said first switching arm, and a connection node of said transistor in each switching arm being between said load transistor and said at least one cascode transistor.

16. An integrated circuit according to claim 14, wherein said control circuit comprises:
   a follower transistor connected in series with said at least one cascode transistor and said first transistor in said first switching arm, and a connection point between said at least one cascode transistor and said follower transistor for supplying the control signal to said switching transistor; and
   a voltage translator circuit for translating a level of the voltage of the output line to the low voltage for providing a follower control signal to said follower transistor.

17. An integrated circuit according to claim 16, wherein said voltage translator circuit comprises:
   a first arm comprising
      a first transistor comprising a control terminal and a conducting terminal connected to each other at a bias node, the bias node receiving a first bias voltage, and
      a first assembly of at least one diode configured transistor connected in series between the low voltage and the bias node for supplying the first bias voltage; and
   a second arm comprising
      a second transistor connected as a current mirror with respect to said first transistor, and
      a second assembly of diode configured transistors connected in series between the output line and said second transistor, and a connection node between said second assembly of diode configured transistors and said second transistor providing the control signal to said follower transistor.

18. An integrated circuit according to claim 11, wherein said switching circuit further comprises:
   a first switching arm associated with the output line; and
   a second switching arm connected to said first switching arm;
   each switching arm comprising a load transistor connected to the high voltage, a first transistor connected to the low voltage and comprising a control terminal for receiving a logic control signal, and at least one cascode transistor connected between said load transistor and said first transistor, and a signal on a control signal connection node between said load transistor and said at least one cascode transistor of one of said switching arms is applied as an control signal to said load transistor of the other switching arm;
   said first switching arm further comprising an additional load transistor connected between the high voltage and the at least one output line and being controlled by the control signal.

19. An integrated circuit according to claim 18, wherein said switching circuit further comprises a transistor configured as a resistor connected between said first and second switching arms for favoring biasing of said at least one cascode transistor in said first switching arm, and a connection node of said transistor in each switching arm being between said load transistor and said at least one cascode transistor.

20. An integrated circuit according to claim 18, wherein said control circuit comprises:
   a follower transistor connected in series with said at least one cascode transistor and said first transistor in said first switching arm, and a connection point between said at least one cascode transistor and said follower transistor for supplying the control signal to said switching transistor; and
   a voltage translator circuit for translating a level of the voltage of the at least one output line to the low voltage for providing a follower control signal to said follower transistor.

21. A An integrated circuit according to claim 20, wherein said voltage translator circuit comprises:
   a first arm comprising
      a first transistor comprising a control terminal and a conducting terminal connected to each other at a bias node, the bias node receiving a first bias voltage, and
      a first assembly of at least one diode configured transistor connected in series between the low voltage and the bias node for supplying the first bias voltage; and
   a second arm comprising
      a second transistor connected as a current mirror with respect to said first transistor, and
      a second assembly of diode configured transistors connected in series between the output line and said second transistor, and a connection node between said second assembly of diode configured transistors and said second transistor providing the follower control signal to said follower transistor.

22. A memory device comprising:
   at least one switching device connected to at least one memory cell selection line, and comprising
      a switching circuit for switching a high voltage to the at least one memory cell selection line, and for providing a control signal;
      a switching transistor connected to said switching circuit for switching a low voltage to the at least one memory cell selection lines based upon the control signal, the control signal having a first level to turn said switching transistor off when said switching circuit applies the high voltage to the at least one memory cell selection line, and a second level to turn said switching transistor on so that the low voltage is applied to the at least one output line; and
      a control circuit connected to said switching circuit and to said switching transistor for providing a control loop for controlling a drop in voltage of the control signal applied to said switching transistor based upon a drop in voltage on the at least one memory cell selection line from the high voltage to the low voltage; and
   a row of memory cells connected to the at least one memory cell selection line for receiving the high voltage or the low voltage.

23. A memory device according to claim 22, wherein said row of memory cells form at least part of a FAMOS memory and a Flash EPROM.

24. A memory device according to claim 22, wherein said switching circuit further comprises:
   a first switching arm connected to the at least one memory cell selection line; and
   a second switching arm connected to said first switching arm; and
   each switching arm comprising a load transistor connected to the high voltage, a first transistor connected to the low voltage and comprising a control terminal for receiving a logic control signal, and at least one cascode transistor connected between said load transistor and said first transistor, and a signal on a control signal connection node between said load transistor and said at least one cascode transistor of one of said switching arms is applied as an control signal to said load transistor of the other switching arm;

said first switching arm having a control signal connection node and an output line connection node between said load transistor and said at least one cascode transistor.

25. A memory device according to claim 24, wherein said switching circuit further comprises a transistor configured as a resistor connected between said first and second switching arms for favoring biasing of said at least one cascode transistor in said first switching arm, and a connection node of said transistor in each switching arm being between said load transistor and said at least one cascode transistor.

26. A memory device according to claim 24, wherein said control circuit comprises:

a follower transistor connected in series with said at least one cascode transistor and said first transistor in said first switching arm, and a connection point between said at least one cascode transistor and said follower transistor for supplying the control signal of said switching transistor; and a voltage translator circuit for translating a level of the voltage of the at least one memory cell selection line to the low voltage for providing a follower control signal to said follower transistor.

27. A memory device according to claim 26, wherein said voltage translator circuit comprises:

a first arm comprising
a first transistor comprising a control terminal and a conducting terminal connected to each other at a bias node, the bias node receiving a first bias voltage, and
a first assembly of at least one diode configured transistor connected in series between the low voltage and the bias node for supplying the first bias voltage; and a second arm comprising
a second transistor connected as a current mirror with respect to said first transistor, and
a second assembly of diode configured transistors connected in series between the output line and said second transistor, and a connection node between said second assembly of diode configured transistors and said second transistor providing the follower control signal to said follower transistor.

28. A memory device according to claim 22, wherein said switching circuit further comprises:

a first switching arm associated with the at least one memory cell selection line; and
a second switching arm connected to said first switching arm;
each switching arm comprising a load transistor connected to the high voltage, a first transistor connected to the low voltage and comprising a control terminal for receiving a logic control signal, and at least one cascode transistor connected between said load transistor and said first transistor, and a signal on a control signal connection node between said load transistor and said at least one cascode transistor of one of said switching arms is applied as an control signal to said load transistor of the other switching arm;
said first switching arm further comprising an additional load transistor connected between the high voltage and the at least one memory cell selection line, and being controlled by the control signal.

29. A memory device according to claim 28, wherein said switching circuit further comprises a transistor configured as a resistor connected between said first and second switching arms for favoring biasing of said at least one cascode transistor in said first switching arm, and a connection node of said transistor in each switching arm being between said load transistor and said at least one cascode transistor.

30. A memory device according to claim 28, wherein said control circuit comprises:

a follower transistor connected in series with said at least one cascode transistor and said first transistor in said first switching arm, and a connection point between said at least one cascode transistor and said follower transistor for supplying the control signal to said switching transistor; and a voltage translator circuit for translating a level of the voltage of the at least one memory cell selection line to the low voltage for providing a follower control signal to said follower transistor.

31. A memory device according to claim 30, wherein said voltage translator circuit comprises:

a first arm comprising
a first transistor comprising a control terminal and a conducting terminal connected to each other at a bias node, the bias node receiving a first bias voltage, and
a first assembly of at least one diode configured transistor connected in series between the low voltage and the bias node for supplying the first bias voltage; and a second arm comprising
a second transistor connected as a current mirror with respect to said first transistor, and
a second assembly of diode configured transistors connected in series between the output line and said second transistor, and a connection node between said second assembly of diode configured transistors and said second transistor providing the follower control signal to said follower transistor.

32. A method for switching a high voltage and a low voltage to an output line using a switching circuit for switching the high voltage to the output line and for providing a control signal, and a switching transistor connected to the switching circuit for switching the low voltage to the output line based upon the control signal, the control signal having a first level to turn the switching transistor off when the switching circuit applies the high voltage to the output line, and having a second level to turn the switching transistor on so that the low voltage is applied to the output line, the method comprising:

controlling a drop in voltage of the control signal applied to the switching transistor based upon a drop in voltage on the output line from the high voltage to the low voltage.

33. A method according to claim 32, wherein the switching circuit comprises:

a first switching arm to the output line; and
a second switching arm to the first switching arm; and
each switching arm comprising a load transistor connected to the high voltage, a first transistor connected to the low voltage and comprising a control terminal for receiving a logic control signal, and at least one cascode transistor connected between the load transistor and the first transistor, and a signal on a control signal connection node between the load transistor and the at least one cascode transistor of one of the switching arms is applied as an arm control signal to the load transistor of the other switching arm;

the first switching arm having a control signal connection node and an output line connection node between the load transistor and the at least one cascode transistor.

34. A method according to claim 33, wherein controlling the drop in voltage comprises:

connecting a follower transistor in series with the at least one cascode transistor and the first transistor in the first switching arm, and a connection point between the at least one cascode transistor and the follower transistor for providing the control signal to the switching transistor; and connecting a voltage translator circuit to the follower transistor for translating a level of the voltage of the output line to the low voltage for providing a follower control signal said follower transistor.

35. A method according to claim 34, wherein the voltage translator circuit comprises:

providing a first arm comprising
a first transistor comprising a control terminal and a conducting terminal connected to each other at a bias node, the bias node receiving a first bias voltage, and
a first assembly of at least one diode configured transistor in series between the low voltage and the bias node for supplying the first bias voltage; and providing a second arm comprising
a second transistor connected as a current mirror with respect to the first transistor, and
a second assembly of diode configured transistors in series between the output line and the second transistor, and a connection node between the second assembly of diode configured transistors and the second transistor providing the follower control signal to the follower transistor.

36. A method according to claim 32, wherein the switching circuit further comprises:

connecting a first switching arm to the output line; and
connecting a second switching arm to the first switching arm;

each switching arm comprising a load transistor connected to the high voltage, a first transistor connected to the low voltage and comprising a control terminal for receiving a logic control signal, and at least one cascode transistor connected between the load transistor and the first transistor, and a signal on a control signal connection node between the load transistor and the at least one cascode transistor of one of the switching arms is applied as an arm control signal to the load transistor of the other switching arm;

the first switching arm further comprising an additional load transistor connected between the high voltage and the output line, and being controlled by the control signal.

37. A method according to claim 36, wherein controlling the drop in voltage comprises:

connecting a follower transistor in series with the at least one cascode transistor and the first transistor in the first switching arm, and a connection point between the at least one cascode transistor and the follower transistor for providing the control signal to the switching transistor; and connecting a voltage translator circuit to the follower transistor for translating a level of the voltage of the output line to the low voltage for providing a follower control signal to said follower transistor.

38. A method according to claim 37, wherein the voltage translator circuit comprises:

providing a first arm comprising
a first transistor comprising a control terminal and a conducting terminal connected to each other at a bias node, the bias node receiving a first bias voltage, and
a first assembly of at least one diode configured transistor connected in series between the low voltage and the bias node for supplying the first bias voltage; and providing a second arm comprising
a second transistor connected as a current mirror with respect to the first transistor, and
a second assembly of diode configured transistors connected in series between the output line and the second transistor, and a connection node between the second assembly of diode configured transistors and the second transistor providing the control signal to the follower transistor.

* * * * *

UNITED STATES PATENT AND TRADEMARK OFFICE
CERTIFICATE OF CORRECTION

PATENT NO.     : 6,639,427 B2
DATED          : October 28, 2003
INVENTOR(S)    : Dray et al.

It is certified that error appears in the above-identified patent and that said Letters Patent is hereby corrected as shown below:

Drawings,
Delete FIG. 1 insert new FIG. 1

Fig. 1
(PRIOR ART)

Column 1,
Line 16, delete "accelerates" insert -- accelerate --

Column 4,
Line 30, delete "logic a" insert -- a logic --

Column 9,
Line 54, delete "as an control" insert -- as a control --

Column 10,
Line 13, delete "A An" insert -- An --

UNITED STATES PATENT AND TRADEMARK OFFICE
CERTIFICATE OF CORRECTION

PATENT NO.    : 6,639,427 B2
DATED         : October 28, 2003
INVENTOR(S)   : Dray et al.

It is certified that error appears in the above-identified patent and that said Letters Patent is hereby corrected as shown below:

Column 11,
Lines 7 and 64, delete "as an control" insert -- as a control --

Column 13,
Line 18, delete "signal said" insert -- signal to said --

Signed and Sealed this

Fourteenth Day of September, 2004

JON W. DUDAS
*Director of the United States Patent and Trademark Office*